United States Patent [19]

Jayaraman

[11] Patent Number: 5,256,521
[45] Date of Patent: Oct. 26, 1993

[54] PROCESS OF DEVELOPING A POSITIVE PATTERN IN AN O-QUINONE DIAZIDE PHOTORESIST CONTAINING A TRIS-(HYDROXYPHENYL) LOWER ALKANE COMPOUND SENSITIVITY ENHANCER

[75] Inventor: Tripunithura V. Jayaraman, East Greenwich, R.I.

[73] Assignee: OCG Microelectronic Materials, Inc., Cheshire, Conn.

[21] Appl. No.: 11,572

[22] Filed: Feb. 1, 1993

Related U.S. Application Data

[62] Division of Ser. No. 409,221, Sep. 19, 1989, Pat. No. 5,215,856.

[51] Int. Cl.$^5$ .................... G03F 7/30; G03F 7/023
[52] U.S. Cl. .................. 430/296; 430/165; 430/326; 430/942
[58] Field of Search ........... 430/296, 326, 165, 191, 430/192, 193, 942

[56] References Cited

U.S. PATENT DOCUMENTS

| | | | |
|---|---|---|---|
| 3,188,210 | 6/1965 | Fritz et al. | 430/193 |
| 3,579,542 | 5/1971 | Meyer et al. | |
| 4,394,496 | 7/1983 | Schrader. | |
| 4,738,915 | 4/1988 | Komine et al. | 430/191 |
| 4,863,828 | 9/1989 | Kawabe et al. | 430/191 |
| 4,871,645 | 10/1989 | Uenishi et al. | 430/192 |

FOREIGN PATENT DOCUMENTS

| | | | |
|---|---|---|---|
| 301332 | 2/1989 | European Pat. Off. | 430/191 |
| 60-150047 | 8/1985 | Japan | 430/191 |
| 63-261256 | 10/1988 | Japan | 430/192 |

OTHER PUBLICATIONS

Celanese Preliminary Information Bulletin for tris(-p-hydroxyphenyl) ethane (no copyright date).

*Primary Examiner*—Charles L. Bowers, Jr.
*Assistant Examiner*—Christopher G. Young
*Attorney, Agent, or Firm*—William A. Simons

[57] ABSTRACT

A radiation-sensitive composition comprising an admixture in a solvent of: at least one alkali-soluble binder resin, at least one photoactive compound and an effective sensitivity enhancing amount of at least one tris (hydroxyphenyl) lower alkane compound; the amount of said binder resin being about 60% to 95% by weight, the amount of said photoactive component being about 5% to about 40% by weight, based on the total solids content of said radiation-sensitive composition.

6 Claims, No Drawings

PROCESS OF DEVELOPING A POSITIVE PATTERN IN AN O-QUINONE DIAZIDE PHOTORESIST CONTAINING A TRIS-(HYDROXYPHENYL) LOWER ALKANE COMPOUND SENSITIVITY ENHANCER

This application is a division of application Ser. No. 07/409,221 filed Sep. 19, 1989 now U.S. Pat. No. 5,215,856.

The present invention relates to radiation sensitive mixtures (e.g. those particularly useful as positive-working resist compositions) containing the admixture of an alkali-soluble binder resin, a photoactive compound and an effective sensitivity enhancing amount of at least one tris(hydroxyphenyl) lower alkane compound all dissolved in a solvent. Furthermore, the present invention also relates to substrates coated with these radiation sensitive mixtures as well as the process of coating, imaging and developing these radiation sensitive mixtures on these substrates.

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The preferred method of applying this film is spin coating. By this method, much of the solvent in the photoresist formulation is removed by the spinning operation. The coated substrate is then baked to evaporate any remaining solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions—negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited but not exposed to the radiation. On the other hand, when positive-working photoresist compositions are exposed image-wise to radiation, those areas of the resist composition exposed to the radiation become more soluble to the developer solution (e.g. the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. The desired portion of the underlying substrate surface is uncovered where the photoresist was exposed to the radiation.

Positive-working photoresist compositions are currently favored over negative-working resists because the former generally have better resolution capabilities and pattern transfer characteristics.

After this development operation, the now partially unprotected substrate may be treated with a substrate-etchant solution or plasma gases and the like. This etchant solution or plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photo-resist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

End users of photoresists are demanding photoresist formulations possess better lithographic properties for the fabrication of smaller microelectronic circuits. The lithographic properties which are critical to positive-working photoresist end-users include the following: (1) good resolution capabilities in both the micron and submicron ranges without incomplete development in the exposed areas (i.e. scumming); (2) higher thermal image deformation temperatures (e.g. above 120° C.); (3) relatively fast photospeeds; (4) good adhesion to substrate; (5) good developer dissolution rates; (6) good process latitude; (7) near to absolute vertical profiles (or good contrast) between exposed and unexposed photoresist areas after development; (8) good resistance to etching solutions and plasma etching techniques; (9) reduced tendency to form insoluble particulates; and (10) mask linearity.

Generally in the past, efforts to improve one of these lithographic properties have caused significant decreases in one or more of the other lithographic properties of the photoresist. Accordingly, there is a need for improved photoresist formulations which possess all of these desired properties without making significant tradeoffs. The present invention is believed to be an answer to that need.

For example, it is well known to add sensitivity enhancers (also known as photospeed enhancers or speed enhancers) to resist formulation to increase the solubility of the resist coating in both the exposed and unexposed areas when the speed of development is an overriding processing consideration. However, some degree of contrast may be sacrificed with the addition of such sensitivity enhancers, (e.g. in positive-working resists, while the exposed areas of the resist coating will be more quickly developed, the sensitivity enhancers will also cause a larger loss of the resist coating from the unexposed areas). Thus, if too much resist coating is removed from the unexposed areas of a positive-working resins, film defects such as pinholes may be introduced into the coating or subsequent plasma etching steps may cause unwanted break-throughs in the unexposed areas. Accordingly, sensitivity enhancers should provide the desired increased speed of development without too much more film loss in the unexposed areas.

Numerous compounds have been proposed as sensitivity enhancers in resist compounds. See U.S. Pat. Nos. 3,661,582; 4,009,033; 4,036,644; 4,115,128; 4,275,139; 4,365,019; 4,650,745; and 4,738,915 for examples of known sensitivity enhancers. All of these U.S. Patents are incorporated herein by reference in their entities. While their known sensitivity enhancers may be suitable for some resist formulation or for some particular end uses, there is a need for new sensitivity enhancers which have better sensitivity enhancement without significant film loss in other resist formulations or in other end uses, or are suitable in a certain combination of resist formulations or a combination of end uses to which the previously known sensitivity enhancers are not suitable. The present invention is believed to be an answer to this need.

Separately, tris(hydroxyphenyl) alkanes are known compounds. See U.S. Pat. No. 3,579,542, which issued to Meyer, et al. on May 18, 1971 and U.S. Pat. No. 4,394,496, which issued to Schrader on Jul. 19, 1983. The Meyer, et al. patent teaches the preparation of tris(p-hydroxyphenyl) ethane and its use as having laxative properties. The Schrader patent teaches the use of tris(hydroxyphenyl) alkanes as chemical intermediates for an epoxidation reaction. Both of these two U.S. Patents are incorporated herein by reference in their entireties.

Accordingly, the present invention is directed to a radiation sensitive composition useful as a positive-working resist comprising an admixture in a solvent of:
 (a) at least one photoactive compound;
 (b) at least one alkali-soluble binder resin; and
 (c) an effective sensitivity enhancing amount of at least one tris(hydroxyphenyl) lower alkane compound; the amount of said photoactive compound or compounds being about 5% to about 40% by weight and the amount of said binder resin or resins being about 60% to 95% by weight, based on the total solids content of said radiation sensitive mixture.

Furtherover, the present invention also encompasses the process of coating substrates with these radiation sensitive mixtures and their exposing and developing these coated substrates.

Also further, the present invention encompasses said coated substrates (both before and after imaging) as novel articles of manufacture.

As mentioned above, the radiation-sensitive compositions of the present invention have three critical ingredients; at least one alkali-soluble binder resin; at least one photoactive compound; and at least one tris(hydroxyphenyl) lower alkane compound.

Any or all binder resins commonly employed in photoresist compositions may be used herein. The preferred class of binder resins is alkali-soluble resin or resins which are useful in positive-working photoresist compositions. The term "alkali-soluble binder resin" is used herein to mean a resin which will dissolve completely in an aqueous alkaline developing solution conventionally used with positive-working photoresist compositions. Suitable alkali-soluble resins include phenolic novolaks such as phenol-formaldehyde novolak resins, cresol-formaldehyde novolak resins, or polyvinyl phenol resins, preferably those having an average molecular weight of about 500 to about 40,000, and more preferably from about 800 to 20,000. The novolak resins are preferably prepared by the condensation reaction of phenol or cresols with formaldehyde and are characterized by being light-stable, water-insoluble, alkali-soluble and film-forming. The most preferred class of novolak resins is formed by the condensation reaction between a mixture of meta- and para-cresols with formaldehyde.

Any and all photoactive compounds which make radiation-sensitive mixtures useful as photoresists may be employed herein. The preferred class of photoactive compounds (sometimes called "sensitizers") is o-quinonediazide compounds, particularly esters derived from polyhydric phenols, alkyl-polyhydroxyphenones, aryl-polyhydroxyphenones, and the like which can contain up to six or more sites for esterification. The most preferred o-quinonediazide esters are derived from 3-diazo-3,4-dihydro-4-oxo-naphthalene-1-sulfonic acid chloride (also know as 1,2-naphthoquinonediazide-4-sulfinyl chloride) and 6-diazo-5,6-dihydro-5-oxo-naphthalene-1-sulfonic acid chloride (also known as 1,2-naphthoquinonediazide-5-sulfonyl chloride).

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxy-benzophenone 1,2-naphthoquinonediazied-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinone-diazide-5-sulfonic acid esters, 2,2',4,4'-tetrahydroxy-benzophenone 1,2-naphthoquinonediazide-5-sulfonic acid esters, 2,3,4,4'-tetrahydroxy-benzophenone 1,2-naphthoquinonediazide-5-sulfonic acid esters, 2,3,4,4'-tetrahydroxybenzophenone 1,2-naphthoquinone-diazide-4-sulfonic acid esters, 2,2',3,4',6'-penta-hydroxybenzophenone 1,2-naphthoquinone-diazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)-hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinone-diazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-tri-1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems," 339–352 (1965), John Wiley & Sons (New York) or in S. DeForest, "Photoresist," 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexaesters of polyhydroxy compounds having at least 2 hydroxyl groups, i.e. about 2 to 6 hydroxyl groups, are one class of preferred compounds.

Among this class of preferred 1,2-naphthoquinonediazide compounds are 2,3,4-trihydroxybenzophenone 1,2-naphthoquinone-diazide-5-sulfonic acid esters, 2,3,4,4'-tetrahydroxy-benzophenone 1,2-naphthoquinonediazide-5-sulfonic acid esters, and 2,2',4,4'-tetra-hydroxybenzophenone 1,2-naphthoquinonediazide-5-sulfonic acid esters. Another preferred 1,2-quinonediazide compound is mixed 1,2-naphthoquinonediazide-5-sulfonic acid esters of 2,2'3,3'-tetrahydro-3,3,3',3'-tetramethyl-1,1-spirobi (1H-indene)-5,5'6,6'7,7'-hexol (C.A.S. Reg. No. 32737-33-0). These 1,2-naphthoquinonediazide compounds may be used alone or in combination of two or more.

The proportion of the photoactive compound in the radiation-sensitive mixture may range from about 5% to about 40%, more preferably from about 10% to about 25% by weight of the non-volatile (e.g. non-solvent) content of the radiation-sensitive mixture. The proportion of total binder resin of this present invention in the radiation-sensitive mixture may range from about 60% to about 95%, preferably, from about 75% to 90% by weight, of the non-volatile (e.g. excluding solvents) content of the radiation-sensitive mixture.

The third critical ingredient of the radiation-sensitive composition of the present invention is the tris(hydroxyphenyl) lower alkane compound or mixture of such compounds. The preferred class of tris(hydroxyphenyl) lower alkane is tris(hydroxyphenyl) ethanes. The preferred tris(hydroxyphenyl) ethane is tris(p-hydroxyphenyl) ethane.

The generic formula for the tris(hydroxyphenol) lower alkane compounds used in the present invention is as follows:

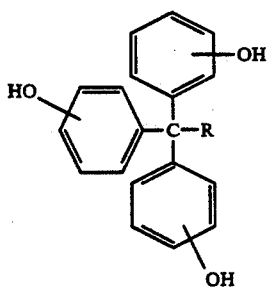

wherein R is a hydrogen or an alkyl having 1-3 carbon atoms.

The generic formula for tris(hydroxyphenyl) ethane compounds used in the present invention is as follows:

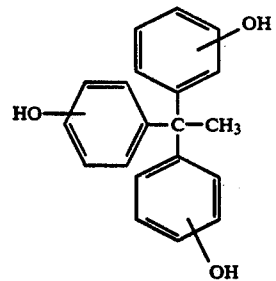

Besides the preferred tris(p-hydroxyphenyl) ethane, other known tris (hydroxyphenyl) ethanes include o,p,p'-hydroxyphenyl ethane (See U.S. Pat. No. 4,394,496).

The preferred tris(p-hydroxyphenyl) ethane is a commercially available product. Its synthesis is also taught in U.S. Pat. No. 3,579,542 which issued to Meyer, et al. on May 18, 1971.

The preferred proportion of the tris(hydroxyphenyl) lower alkane compound or compounds in the radiation-sensitive mixture may range from about 0.5% to about 10%, preferably about 2% to 4% by weight of the non-volatile (e.g., excluding solvents) content of the radiation-sensitive mixture.

These radiation-sensitive mixtures may also contain, besides the resin, photoactive compound and tris (hydroxyphenyl) lower alkane compound, conventional photoresist composition ingredients such as other resins, solvents, actinic and contrast dyes, anti-striation agents, plasticizers, other sensitivity enhancers, and the like. These additional ingredients may be added to the binder resin, photoactive compound and tris(hydroxyphenyl) lower alkane compound solution before the solution is coated onto the substrate.

The binder resin, photoactive compound or sensitizer, and tris(hydroxyphenyl) lower alkane compound may be dissolved in a solvent or solvents to facilitate their application to the substrate. Examples of suitable solvents include methoxyacetoxy propane, diglyme, toluene, ethyl cellosolve acetate, n-butyl acetate, ethyl lactate, propylene glycol alkyl ether acetates, or mixtures thereof and the like. Cosolvents such as xylene, n-butylacetate, or ethyl ethoxy propionate or the like may also be used. The preferred amount of solvent may be from about 50% to about 500%, or higher, by weight, more preferably, from about 100% to about 400% by weight, based on combined resin, sensitizer, and tris(hydroxyphenol) lower alkane compound weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400-460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000) and Macrolex Fluoroyellow 10GN (C. I. No. Sovent Yellow 16:1)] and those that absorb light energy at approximately 300-340 nm [e.g. 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)].

The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and sensitizer.

Anti-striation agents level out the photoresist coating or film to a uniform thickness. Anti-striation agents may be used up to five percent by weight levels, based on the combined weight of resin and sensitizer. One suitable class of anti-striation agents is non-ionic silicon-modified polymers. Non-ionic surfactants may also be used for this purpose, including, for example, nonylphenoxy poly The photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate may be preferably baked at approximately 70° C. to 125° C. until substantially all the solvent has evaporated and only a uniform radiation-sensitive coating remains on the substrate.

The coated substrate can then be exposed to radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light and electron beam radiations are the preferred sources of radiation, other sources such as visible light, ion beam and X-ray radiant energy may be instead used. In some instances, a post-exposure bake at a temperature about 10° C. higher than the soft bake temperature for about 30–300 seconds is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In the manufacture of microcircuitry units, the developed substrates may then be treated with a plasma gas etch employing conventional plasma processing parameters (e.g., pressure and gas flow rates) and conventional plasma equipment.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Addition of Tris(p-hydroxyphenyl) ethane to Novolak Resin/Naphthoquinone Diazide Photoactive Compound-Containing Resist A. Formulation of Resist Composition Tris(p-hydroxyphenyl) ethane [0.92 grams (0.003 mole)] was added to 100 grams of a commercially available resist (HEBR-214-1 available from Olin Hunt Specialty Products Inc. of West Paterson, New Jersey) consisting of a mixed meta- and para-cresol novolak resin and a naphthoquinone diazide ester photoactive compound in a mixed solvent. The resulting resist composition contained about 27% by weight solids.

B. Coating Substrate with Resist

The resist made according to Part A and a control resist (i.e. HEBR-214 with no additive) were coated on oxidized four inch silicon wafers with a MTC resist spinner at 5000 rpm for 30 seconds and then soft baked at 100° C. for 30 minutes in a convection oven. The resulting soft baked resist coatings were measured in Angstroms on a Rudolph Film Thickness Monitor FTM-R using a refractive index of 1.63. These thicknesses are shown in Table 1.

C. Imaging the Resist Coating

The resist coated substrate samples of Part B were then imagewise exposed to an electron beam energy source using a JEOL 845/TN 5500 system at an acceleration voltage of 20 KV at a constant beam current. The electron beam dwell time was varied to obtain various exposure doses at different parts of the coating.

D. Development of Imagewise Exposed Resist Coatings

After the exposure in Part C, the resist coatings on the silicon wafers were developed by immersion for two minutes in diluted WAYCOAT LSI developer (5 parts developer diluted with 4 parts deionized water on a volume basis), then rinsed in deionized water and blow-dried with nitrogen. The developed photoresist coatings were measured for film thickness loss and the sensitivities of the resist of this Example 1 and its control were measured.

E. Measurement of Film Thickness Loss and Sensitivities

The film thickness loss measurements were carried out on a Rudolph Film Thickness Monitor FTM-R using a refractive index of 1.63. The sensitivities reported below were the electron doses in uC/cm$^2$ required to clearly image 2 micron lines and spaces. The measured film thickness loss (in Angstroms) and sensitivity are shown in the following Table 1:

TABLE 1

| Example | Soft Baked Film Thickness Ang. | Film Thickness Loss Ang. | Sensitivity (uC/cm$^2$) |
| --- | --- | --- | --- |
| 1 | 10,259 | 376 | 20 |
| Control | 9,780 | 300 | 30 |

The data in this Table 1 indicates that the addition of tris(p-hydroxyphenyl) ethane increased the electron beam sensitivity of HEBR 214-1 from 30 to 20 uC/cm$^2$ with only a small increase of film loss of 76 Angstroms, which is acceptable for most applications.

What is claimed is:

1. The process of developing an image-wise exposed photoresist-coated substrate comprising:
   (a) coating said substrate with a radiation-sensitive composition useful as a photoresist, said composition comprising an admixture in a solvent of: at least one alkali-soluble binder resin, at least one o-quinonediazide photoactive compound and an effective sensitivity enhancing amount of at least one tris(hydroxyphenyl) lower alkane compound; the amount of said binder resin being about 60% to 95% by weight, the amount of said photoactive component being about 5% to about 40% of weight, based on the total solids content of said radiation-sensitive composition;
   (b) subjecting said coating on said substrate to an image-wise exposure of radiant light energy; and
   (c) subjecting said image-wise exposed coated substrate to a developing solution to remove the image-wise exposed areas and to form a positive image-wise pattern in the coating.

2. The process of claim 1 wherein said binder resin is an alkali-soluble phenolic novolak resin.

3. The process of claim 1 wherein said o-quinonediazide photoactive compound or compounds are present in the amount of about 10% to about 25% by weight, said binder resin is present in the amount of about 75% to about 90% by weight and said tris(hydroxyphenyl) lower alkane compound is present in the amount of about 0.5% to about 10% by weight, all based on the total solids content of said radiation-sensitive composition.

4. The process of claim 1 wherein said tris(hydroxyphenyl) lower alkane compound is present in the amount from about 2% to about 5% by weight, based on the total solids content of said radiation-sensitive composition.

5. The process of claim 1 wherein said tris(hydroxyphenyl) lower alkane compound is tris(p-hydroxyphenyl) ethane.

6. The process of claim 1 wherein said imaging is carried out with electron beam radiation.

* * * * *